(12) United States Patent
Aronowitz et al.

(10) Patent No.: US 6,989,565 B1
(45) Date of Patent: Jan. 24, 2006

(54) MEMORY DEVICE HAVING AN ELECTRON TRAPPING LAYER IN A HIGH-K DIELECTRIC GATE STACK

(75) Inventors: Sheldon Aronowitz, San Jose, CA (US); Vladimir Zubkov, Mountain View, CA (US); Grace S. Sun, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/698,169

(22) Filed: Oct. 31, 2003
(Under 37 CFR 1.47)

Related U.S. Application Data

(63) Continuation-in-part of application No. 10/123,263, filed on Apr. 15, 2002.

(51) Int. Cl.
*H01L 29/792* (2006.01)
(52) U.S. Cl. .................. 257/324; 257/325
(58) Field of Classification Search ........ 257/288, 257/324–325, 410, 411, 314, 322
See application file for complete search history.

(56) References Cited

U.S. PATENT DOCUMENTS

| | | | |
|---|---|---|---|
| 5,880,508 A * | 3/1999 | Wu | 257/411 |
| 6,445,030 B1 * | 9/2002 | Wu et al. | 257/315 |
| 6,576,967 B1 * | 6/2003 | Schaeffer et al. | 257/411 |
| 6,800,519 B2 * | 10/2004 | Muraoka et al. | 438/216 |
| 2001/0038135 A1 | 11/2001 | Forbes et al. | |
| 2002/0000593 A1 * | 1/2002 | Nishiyama et al. | 257/296 |
| 2002/0153579 A1 * | 10/2002 | Yamamoto | 257/412 |

OTHER PUBLICATIONS

U.S. Appl. No. 10/123,263, filed Apr. 15, 2002.
S. M. Sze, Physics of Semiconductor Devices (John Wiley & Sons, New York Ed., 1985) Section 8.6.2.
Guha et al., "Compatibility Challenges for High-K Materials Integration into CMOS Technology", MRS Bulletin, Mar. 2002, p. 226-229.
Stanley Wolf et al., "Silicon Processing for the VLSI Era, vol. 1: Process Technology", Lattice Press, Sunset Beach, CA, 1986, p. 303-306.

* cited by examiner

*Primary Examiner*—Anh Duy Mai
(74) *Attorney, Agent, or Firm*—Beyer Weaver & Thomas, LLP

(57) ABSTRACT

An improved semiconductor memory structure and methods for its fabrication are disclosed. The memory structure includes a semiconductor substrate having a dielectric stack formed over a channel region of a semiconductor substrate. The dielectric stack includes a layer of electron trapping material that operates as a charge storage center for memory devices. A gate electrode is connected with the top of the dielectric stack. In various embodiments the electron trapping material forms a greater or lesser portion of the dielectric stack. The invention includes a method embodiment for forming such a memory device.

5 Claims, 2 Drawing Sheets

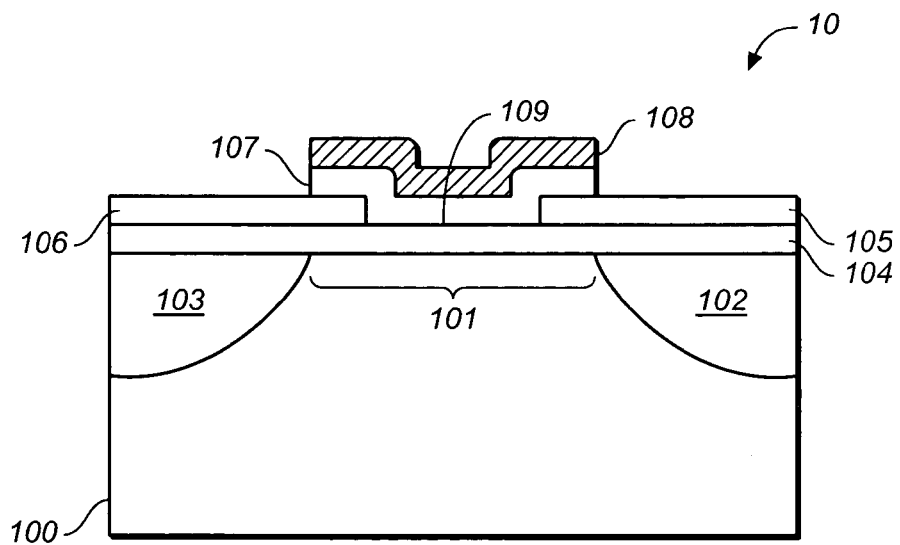
FIG._1 (PRIOR ART)
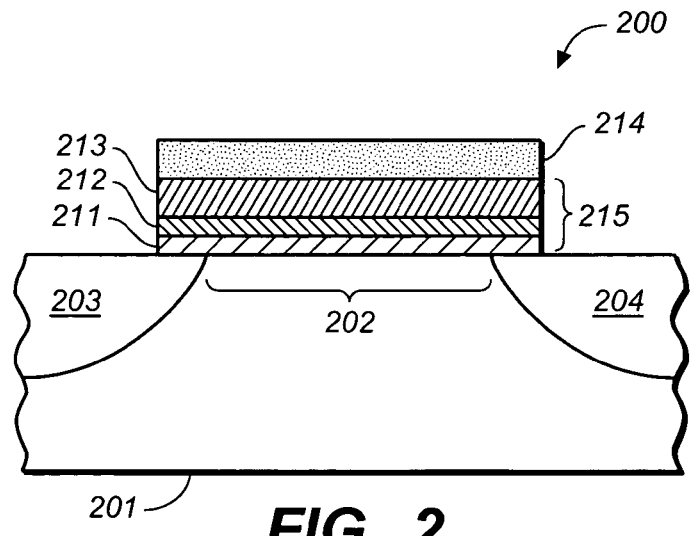
FIG._2
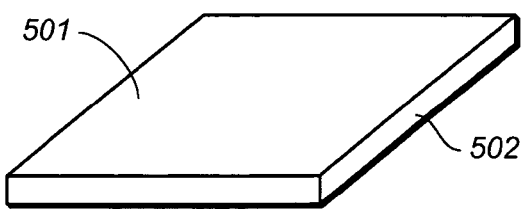
FIG._5

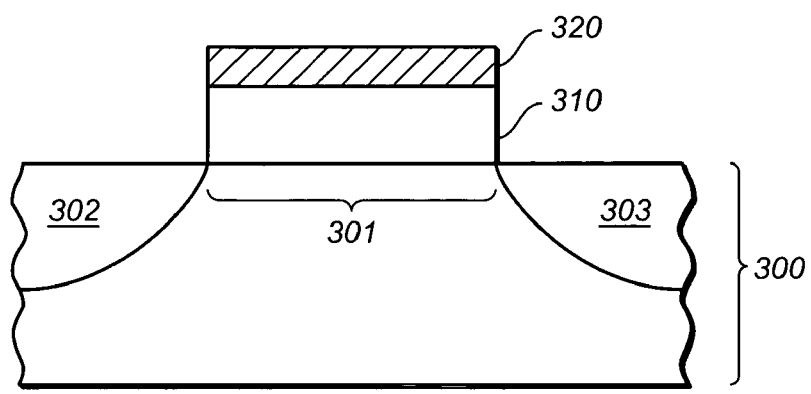
FIG._3a
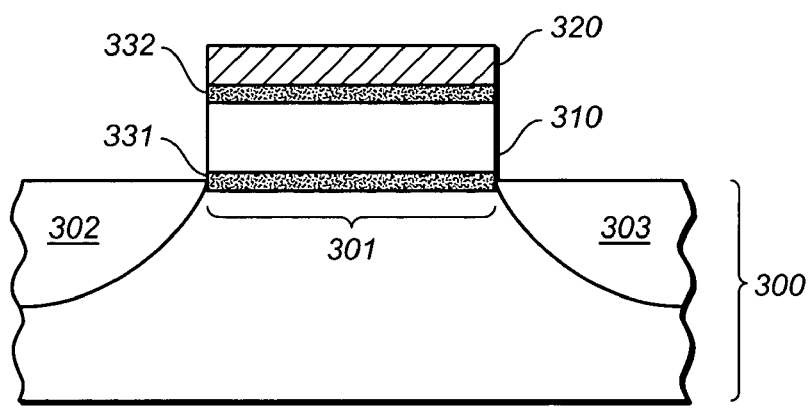
FIG._3b
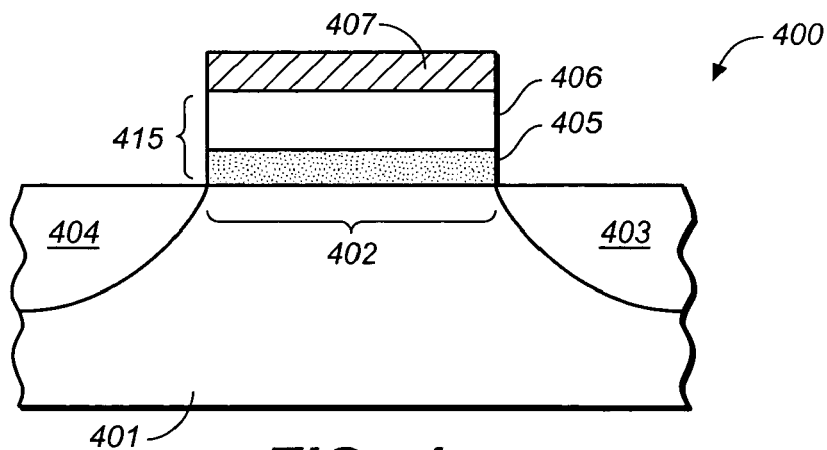
FIG._4

MEMORY DEVICE HAVING AN ELECTRON TRAPPING LAYER IN A HIGH-K DIELECTRIC GATE STACK

CROSS-REFERENCE TO RELATED APPLICATIONS

This application is a continuation-in-part application from U.S. patent application Ser. No. 10/123,263, filed Apr. 15, 2002, entitled "Method and Apparatus for Forming a Memory Structure Having an Electron Affinity Region", which is hereby incorporated by reference.

TECHNICAL FIELD

The invention described herein relates generally to semiconductor memory devices and to methods of their manufacture. In particular, the invention relates to memory devices having an electron trapping layer in the high-K dielectric gate stack.

BACKGROUND

One type of semiconductor memory device uses two different dielectric materials forming layers in the channel region of the device to form a charge storage center. The interfacial region between the two different dielectric materials forms an electron trapping region that creates the charge storage center. Such devices are often referred to as MIOS (metal insulator oxide semiconductor) devices. Where the insulator material is silicon nitride such devices are commonly referred to as MNOS devices. Such devices and their properties are well known in the art (e.g., see S. M. Sze, Physics of Semiconductor Devices (John Wiley & Sons, New York, $2^{nd}$ Ed., 1981) Section 8.6.2).

One example of a conventional prior art MIOS memory device is described hereinbelow. In FIG. 1 a portion of typical MIOS memory cell 10 is depicted. A semiconductor substrate 100 (e.g., a p-doped silicon wafer) includes a "channel" region 101 positioned between a source 102 and a drain 103 (e.g., n-doped regions). A first dielectric layer 104 (e.g., silicon dioxide) is formed on the substrate surface. Commonly polysilicon electrodes 105, 106 are formed on the first dielectric layer 104. A second layer of dielectric material 107 is formed over the first dielectric layer 104 and portions of the polysilicon electrodes 105, 106 in the channel region 101. A gate electrode 108 is formed over the second dielectric layer 107. In the interests of simplifying the discussion, the remaining portions of the memory cell 10 are not depicted.

In conventional MIOS memory cells, the first dielectric layer 104 is formed of silicon dioxide and the second dielectric layer 107 is formed of, for example, silicon oxynitride. The interfacial region between the first dielectric layer 104 and the second dielectric layer 107 creates an interfacial charge storage layer 109 which can, among other things, be used to alter the amount of voltage required to change the memory state of the cell. Such devices are relatively small, resistant to ionizing radiation, and can alter the write and erase times (and voltages).

However, such memory structures also suffer from some drawbacks. One drawback is that the interfacial charge storage layer 109 between the first dielectric layer 104 and the second dielectric layer 107 is difficult to form reproducibly and reliably. Additionally, interfacial charge storage layers 109 formed in this manner suffer from unpredictable electron trapping properties, further adding to their unpredictability and reliability problems. This inability to reliably and reproducibly fabricate interfacial charge storage layers leads to unpredictable and inconsistent behavior in such memory structures. Additionally, it is difficult to vary the amount of charge stored by the interfacial charge storage layer 109 or to alter the strength of an electron trapping environment. Thus, such devices are not particularly flexible in their application. Moreover, as feature sizes decrease these problems become aggravated and also more difficult to solve. These problems become particularly intractable as feature sizes decrease below the 0.1 micron ($\mu$) level.

Although suitable for many purposes, conventional MIOS and MNOS memory structures suffer from many difficulties. The principles of the present invention are directed toward improved memory structures and improved methodologies for constructing such memory structures.

SUMMARY OF THE INVENTION

In accordance with the principles of the present invention, the invention includes structures and method for forming improved semiconductor memory structures. One embodiment uses a dielectric stack formed over a channel region of a semiconductor substrate. The dielectric stack includes a layer of electron trapping material that operates as a charge storage center for memory devices. A gate electrode is connected with the top of the dielectric stack. In various embodiments the electron trapping material forms a greater or lesser portion of the dielectric stack.

The invention includes a method embodiment for forming a memory device. The method involves providing a semiconductor substrate and forming a gate stack over a channel region of the substrate. The gate stack is formed such that the gate stack includes a layer of electron trapping material. A gate electrode is then formed connected with the gate stack.

Further embodiments include dielectric stacks having more than one dielectric layer. Moreover, in some embodiments the various dielectric layers can be comprised of different dielectric materials.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIG. 1 is a simplified figurative depiction of a conventional MIOS memory cell.

FIG. 2 is a simplified schematic cross-sectional view of a memory device in accordance with the principles of the present invention.

FIGS. 3(a) and 3(b) are simplified schematic cross-sectional views of a portion of a semiconductor substrate showing aspects of alternative memory device configurations in accordance with the principles of the present invention.

FIG. 4 is a simplified schematic cross-sectional view of a portion of a semiconductor substrate showing aspects of another alternative memory device implementation in accordance with the principles of the present invention.

FIG. 5 is a simplified schematic perspective view of a semiconductor integrated circuit die having one of the memory device embodiments formed thereon in accordance with the principles of the present invention.

It is to be understood that in the drawings like reference numerals designate like structural elements. Also, it is understood that the depictions in the drawings are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Embodiments of the present invention are directed to memory structures having an electron trapping layer and the methods of forming such memory structures. In such structures a high-K electron trapping layer is formed as part of (or in some embodiments the entirety of) a dielectric gate stack formed on a channel portion of a substrate. This electron trapping layer is formed of materials having a relatively high K value (e.g. greater than about 10) and a suitably high electron affinity (i.e. suitably high electron trapping probability), thereby forming a trapping layer which can trap electrons and function as a charge storage center. Such implementations are advantageous due to the large quantity of charge that can be captured (trapped) by the trapping layer. Such implementation can trap substantially more charge than previously known devices which largely depend on charge trapping at interfacial regions alone. This advantage becomes even more pronounced as feature sizes shrink to the deep sub-micron range. Additionally, because the disclosed trapping materials exhibit relatively high K values, the write voltages required for memory cells of the present invention are substantially less that those required for conventional MNOS devices. Detailed descriptions and definitions of the foregoing concepts and materials will be described hereinbelow.

FIG. 2 is an illustration depicting a portion of one embodiment of a memory structure 200 constructed in accordance with the principles of the present invention. The depicted embodiment includes a dielectric gate stack 215 formed on a semiconductor substrate 201. Suitable substrates include, but are not limited to, silicon and gallium arsenide (GaAs) substrates. Such substrates can also include doped substrates. For example, the depicted embodiment is a p-doped silicon substrate 201 (n-doped or un-doped substrates can be used in other embodiments). The substrate 201 includes a channel region 202 positioned between a source 203 and a drain 204. A gate stack 215 is formed in the channel region 202 of the substrate 201 that lies between a source 203 and a drain 204. In the depicted p-doped substrate 201, the source 203 and the drain 204 are typically n-doped second dielectric layer 213. The gate stack 215 includes a layer of electron trapping material 212 (also referred to herein as an electron trapping layer) sandwiched between a first dielectric layer 211 and a second dielectric layer 213. A gate electrode 214 is connected to a top portion of the second dielectric layer 213.

The depicted dielectric gate stack 215 includes a plurality of layers formed over the channel region 202 of the substrate 201. The combined thickness of all layers in the stack 215 can be any thickness, but are preferably greater than about 15 Å thick and still more preferably in the range of about 30–120 Å thick.

In embodiments where a silicon substrate 201 is used, silicon oxides (e.g., $SiO_2$) are particularly attractive materials for use in the dielectric stack 215 due to their relative ease of manufacture. In one implementation, the stack 215 can include a first dielectric layer 211 and a second dielectric layer 213 that sandwiches an electron trapping layer 212 therebetween. The first dielectric layer 211 is formed on the channel 202. Commonly, this first dielectric layer 211 is formed of a silicon oxide (e.g., $SiO_2$) material of between about 5–500 Å thick. Preferably, the first dielectric layer 211 is formed to a thickness in the range of about 5–50 Å thick and still more preferable about 20 Å thick. An oxide first dielectric layer 211 can be easily formed using a number of ordinary silicon oxide fabrication techniques known to persons having ordinary skill in the art. For example, the $SiO_2$ of the first dielectric layer 211 can be thermally grown or formed by using a wide range of alternative deposition techniques. In the depicted embodiment, the first dielectric layer 211 can be formed using RTCVD (Rapid Thermal Chemical Vapor Deposition) to form a silicon dioxide ($SiO_2$) dielectric layer 211. Additionally, the inventors note that other materials, including but not limited to silicon carbide, silicon oxynitride, silicon nitride (especially, amorphous silicon nitride), zirconium dioxide, hafnium dioxide, and many other well known and commercially available dielectric materials may be used to form suitable first dielectric layers.

The electron trapping layer 212 is formed on the first dielectric layer 211. The electron trapping layer 212 is formed of electron trapping materials (compounds having a high affinity for capturing electrons). Preferred electron trapping materials have a relatively high probability of trapping electrons, relatively stable electron trapping properties when exposed to a varying range of stress bias voltages, and a relatively high K value (where the K value refers to the dielectric constant of the material). Materials having relatively high electron trapping probabilities are materials having a substantially higher electron trapping probabilities than for silicon oxides. For example, materials having electron trapping probabilities of three orders of magnitude (or more) greater than silicon dioxide are suitable. Such materials also preferably have relatively high K values (e.g., K values greater than about twelve (12)). Examples of preferred electron trapping materials include, but are not limited to, hafnium oxides (e.g., $HfO_2$); zirconium oxides (e.g., $ZrO_2$), and aluminum oxides (e.g., $Al_2O_3$ (I) and $Al_2O_3$(II)). It should be pointed out that the materials used to form the electron trapping layer 212 are different from the materials used to form the first dielectric layer 211 (e.g., an $HfO_2$ first layer is not used with an associated $HfO_2$ electron trapping layer, and so forth). It is also pointed out that other materials having a suitably high electron trapping probabilities and suitable stable electron trapping probabilities (when exposed to voltage) and sufficiently high K values can also be employed in an electron trapping layer 212. These electron trapping layers 212 can be formed to any desired thickness but are generally formed to a thickness of in the range of about 5–500 Å. In some preferred implementations the electron trapping layers 212 are formed to a thickness in the range of about 20–80 Å thick, most preferably about 60 Å thick. Thicker layers of electron trapping material have greater electron trapping capacity (and also a higher effective dielectric capacity). Electron trapping layers 212 in accordance with the principles of the invention can be formed using standard semiconductor fabrication techniques known to persons having ordinary skill in the art. For example, some suitable techniques include, but are not limited to CVD, ALD, and PVD deposition techniques. For example, if a hafnium oxide layer is desired, such layer can be formed using well-known physical vapor deposition (PVD) techniques. The inventors also contemplate that a wide range of other techniques and methodologies known to persons having ordinary skill in the art can be used to fabricate electron trapping layers 212 in accordance with the principles of the invention.

In the depicted embodiment, a second dielectric layer 213 is formed on the electron trapping layer 212. The second dielectric layer 213 can be formed to any desired thickness but is generally formed having thicknesses in the range of about 5– 500 Å. In one preferred embodiment, a silicon oxide second dielectric layer 213 is formed to a thickness in the range of about 5–50 Å thick, more preferably about 20 Å thick. As with the first dielectric layer 211, silicon oxides (e.g., $SiO_2$) are particularly attractive materials for use in the second dielectric layer 213. In common applications both the first and the second dielectric layers (211, 213) are formed of silicon oxides. As is known to persons having ordinary skill in the art, a wide range of suitable fabrication techniques and methodologies can be used to form a suitable second dielectric layer 213. For example, in one embodiment, a silicon oxide (e.g., $SiO_2$) second dielectric layer 213 can be formed using chemical vapor deposition (CVD) or other suitable techniques. Moreover, as previously indicated, other suitable dielectric materials can be used to form second dielectric layers. Such materials include, but are not limited to silicon carbides, silicon oxynitrides, silicon nitrides (especially, amorphous silicon nitride), zirconium dioxide, hafnium dioxide, and many other well-known and commercially available dielectric materials. The inventors contemplate that the second dielectric layer 213 can be constructed of a different dielectric material than the first dielectric layer 211.

Once the dielectric gate stack 215 is formed, a gate electrode 214 can be formed on the top surface of the stack 215. Commonly, but not exclusively, the gate electrode 214 is formed of polysilicon materials. As is known to persons having ordinary skill in the art, many commonly known polysilicon layer fabrication processes can be used to form the gate electrode 214. Also, as is known to persons having ordinary skill in the art, many other electrode materials (other than polysilicon) can be used to form the gate electrode 214. Such gate electrodes 214 can then be connected with other circuit elements of the substrate 201.

In an alternative embodiment shown in FIG. 3(a), the dielectric stack can be formed entirely of electron trapping material. This can be achieved using, for example, a conventionally constructed semiconductor substrate 300 having a channel region 301 between a source 302 and drain 303. The dielectric stack is formed by fabricating an electron trapping layer 310 directly on the channel region 301. As with the previously described electron trapping layers, this electron trapping layer 310 is formed of same types of electron trapping materials as discussed herein above. For example, preferred electron trapping materials include hafnium oxides (e.g., $HfO_2$); zirconium oxides (e.g., $ZrO_2$); and aluminum oxides (e.g., $Al_2O_3$(I) and $Al_2O_3$ (II)). Other materials having suitable properties (as discussed herein above) can also be employed in the electron trapping layer 310 of the dielectric stack. This electron trapping layer 310 can be formed to any desired thickness but is generally formed to a thickness in the range of about 5–500 Å. Some preferred implementations of the electron trapping layer 310 are formed to a thickness in the range of about 20–80 Å thick, still more preferably about 60 Å thick. Thicker layers of electron trapping material have greater electron trapping capacity (and also a higher effective dielectric capacity). As with the previously described electron trapping layers, standard semiconductor fabrication techniques known to persons having ordinary skill in the art can be used to form the electron trapping layer 310. Preferred fabrication techniques include, but are not limited to CVD, ALD, and PVD techniques. For example, if a hafnium oxide electron trapping layer 310 is desired, such layer can be formed using standard PVD techniques.

Once the electron trapping layer 310 is formed, a gate electrode 320 is formed on the electron trapping layer 310. Typically, the gate electrode 320 is formed of polysilicon although other materials can be used. This gate electrode 320 can then be electrically connected to other circuitry located elsewhere on the substrate 300. This structure is less preferred than the previously described embodiments due to the generally lower adhesion between the electron trapping layer 310 and the adjacent silicon substrate 300 and adjacent polysilicon gate electrode 320.

In a related embodiment, depicted in FIG. 3(b), an interface 331 is formed between the electron trapping layer 310 and the underlying substrate 300. Also, an interface 332 is formed between the electron trapping layer 310 and the polysilicon of the gate electrode 320. In the case of a silicon substrate 300, the interface 331 between the electron trapping layer 310 and the underlying substrate 300 is subject to a certain amount of diffusion such that the interface 331 comprises a mixture of electron trapping materials and silicon. Additionally, in the case of a polysilicon electrode 320, the interface 332 between the electron trapping layer 310 and the electrode 320 is also subject to a certain amount of diffusion such that the interface 332 comprises a mixture of electron trapping materials and silicon. For example, if a $HfO_2$ electron trapping layer 310 is used, the interfaces 331, 332 include a composite materials comprising $Hf_xSi_yO_z$ where x, y, and z each represent integers values of the indicated elements. In another example, if $ZrO_2$ is used in the electron trapping layer 310, then the interfaces 331, 332 include composite materials comprising $Zr_xSi_yO_z$. In another example, if $Al_2O_3$ compounds are used in the electron trapping layer 310, then the interfaces 331, 332 include composite materials comprising $Al_xSi_yO_z$. Annealing can be used to accelerate the formation of the interfaces if desired. For example, rapid thermal annealing at, for example, about 700°–900° C. for about 10–30 s (seconds) can be used. In one preferred process, annealing occurs for about 30 s at about 700° C.

FIG. 4 depicts another embodiment of a memory structure 400 constructed in accordance with the principles of the present invention. The depicted embodiment includes a dielectric gate stack 415 formed on a semiconductor substrate 401. As before, suitable substrates include, but are not limited to, silicon and gallium arsenide (GaAs) substrates. The substrate 401 includes a channel region 402 positioned between a source 403 and a drain 404. A gate stack 415 is formed in the channel region 402 of the substrate 401. The depicted embodiment includes a p-doped substrate 401, and an n-doped source 403 and drain 404. The gate stack 415 includes a first dielectric layer 405 and a layer of electron trapping material 406 formed on the first dielectric layer 404. A gate electrode 407 is connected to a top portion of the first dielectric layer 404. Such layers are formed as previously described in this patent.

Again, in embodiments where a silicon substrate 401 is used, silicon oxides (e.g., $SiO_2$) are particularly attractive materials for use in the first dielectric layer 405. Commonly, this first dielectric layer 405 is formed to a thickness of between about 5–500 Å thick. Preferably, the first dielectric layer 405 is formed to a thickness in the range of about 5–50 Å thick, and still more preferably about 20 Å thick. An silicon oxide first dielectric layer 405 can be easily be formed as described herein. Additionally, the inventors note that other materials, including but not limited to silicon carbide, silicon oxynitride, silicon nitride (amorphous), zirconium dioxide, hafnium dioxide, and many other well known and commercially available dielectric materials may be used to form suitable first dielectric layers.

The electron trapping layer 406 is then formed on the first dielectric layer 405. The electron trapping layer 406 is formed of electron trapping materials described elsewhere in this patent (e.g., hafnium oxides, zirconium oxides, and aluminum oxides). Other suitable electron trapping materials (such as those previously described) can also be employed in the electron trapping layer 406. These electron trapping layers 406 are formed using any of a number of fabrication techniques disclosed herein. The electron trapping layer 406 can be formed to any desired thickness but are generally formed having a thickness in the range of about 5–500 Å. In some preferred implementations the electron trapping layers 406 are formed about 20–80 Å thick, or still more preferably about 60 Å thick.

Once the dielectric gate stack 415 is formed, a gate electrode 407 can be formed on the top surface of the stack 415. As with the other embodiments, the electrode 407 is commonly, but not exclusively, formed of polysilicon materials. Previously described processes can be used to form the gate electrode 407. Also, as is known to persons having ordinary skill in the art, many other electrode materials (other than polysilicon) can be used to form the gate electrode 407. In some embodiments, an interface can be formed between the electrode and the electron trapping layer. The details of such interfaces have already been described and will not be elaborated upon here.

As depicted in FIG. 5, each of the aforementioned memory devices 501 can form part of a semiconductor integrated circuit device 502. After fabrication, each of the previously disclosed embodiments can then be subjected to further processing. For example, the gate electrodes can be interconnected to other circuit structures located elsewhere on the substrate or further layers of circuit structures can be formed over the depicted embodiments.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor memory device comprising:
    a semiconductor substrate;
    a dielectric gate stack comprising at least a first layer and a second layer formed on a channel region of the substrate, the first layer formed of silicon carbide and the second layer formed of a material selected from among silicon carbide, silicon oxynitride, silicon nitride, and amorphous silicon nitride; and
    an electron trapping layer arranged between and in contact with the first and second layers of the stack, the electron trapping layer consists of an electron trapping material selected from zirconium oxide and aluminum oxide.

2. A semiconductor integrated circuit having the memory devices of claim 1 formed thereon.

3. The semiconductor memory device of claim 1 wherein the electron trapping material consists of zirconium oxide.

4. The semiconductor memory device of claim 1 wherein the electron trapping material consists of aluminum oxide.

5. The semiconductor memory device of claim 1 wherein the second layer of the gate stack is formed of a different material than the first layer of gate stack.

* * * * *